United States Patent
Watanabe et al.

(10) Patent No.: US 7,267,127 B2
(45) Date of Patent: Sep. 11, 2007

(54) METHOD FOR MANUFACTURING ELECTRONIC DEVICE

(75) Inventors: Masayuki Watanabe, Toyama (JP); Yukihisa Wada, Kyoto (JP)

(73) Assignee: Matsushita Electric Inductrial Co., Ltd., Osaka (JP)

( * ) Notice: Subject to any disclaimer, the term of this patent is extended or adjusted under 35 U.S.C. 154(b) by 172 days.

(21) Appl. No.: 11/222,749

(22) Filed: Sep. 12, 2005

(65) Prior Publication Data
US 2006/0118516 A1   Jun. 8, 2006

(30) Foreign Application Priority Data
Dec. 2, 2004 (JP) ............................ 2004-349678

(51) Int. Cl.
*B08B 6/00* (2006.01)
*H01L 21/302* (2006.01)

(52) U.S. Cl. .................. 134/1.2; 134/1.3; 438/704; 438/705; 438/720; 438/725; 438/734; 438/749

(58) Field of Classification Search ............... 134/1.2, 134/1.3; 438/704, 705, 720, 725, 734, 749; 216/57, 62, 75, 87
See application file for complete search history.

(56) References Cited

U.S. PATENT DOCUMENTS

| | | | | |
|---|---|---|---|---|
| 5,730,834 A | * | 3/1998 | Gabriel | 438/627 |
| 5,804,505 A | * | 9/1998 | Yamada et al. | 438/643 |
| 6,143,658 A | * | 11/2000 | Donnelly et al. | 438/687 |
| 2003/0219912 A1 | * | 11/2003 | Chen et al. | 438/3 |

FOREIGN PATENT DOCUMENTS

| | | |
|---|---|---|
| JP | 06-151383 | 5/1994 |
| JP | 11-111688 | 4/1999 |
| JP | 11-274127 | * 10/1999 |
| JP | 2000-232096 | * 8/2000 |

* cited by examiner

*Primary Examiner*—George A. Goudreau
(74) *Attorney, Agent, or Firm*—McDermott Will & Emery LLP

(57) ABSTRACT

A method for manufacturing an electronic device comprising the steps of: dry-etching a Ti-containing metal film formed on a substrate with a gas containing fluorine; and treating the substrate with a chemical solution containing fluorine ions after the dry etching step.

12 Claims, 10 Drawing Sheets

* HF 0.1mass%

$$Ti + 6F^- \rightleftharpoons TiF_6^{2-} + 4e^-$$

METHOD FOR MANUFACTURING ELECTRONIC DEVICE

CROSS-REFERENCE TO RELATED APPLICATION

This non-provisional application claims priority under 35 U.S.C. §119(a) on Patent Application No. 2004-349678 filed in Japan on Dec. 2, 2004, the entire contents of which are hereby incorporated by reference.

BACKGROUND OF THE INVENTION (a) Field of the Invention

The present invention relates to a method for manufacturing an electronic device such as a semiconductor device. In particular, it relates to a method for removing a deposit containing titanium fluoride, thereby improving yield of the manufacture of the electronic device.

(b) Description of Related Art

In recent years, for the purpose of improving properties of semiconductor devices in a semiconductor integrated circuit combined with DRAMs (Dynamic Random Access Memories), $Ta_2O_5$ and TiN have been used as a capacitor insulating film and a top electrode, respectively. Hereinafter, with reference to the drawings, an explanation is given of a conventional method for manufacturing a capacitor of a semiconductor device.

FIGS. 11A to 11D and FIGS. 12A to 12C are flow diagrams illustrating the conventional steps of manufacturing the capacitor.

First, as shown in FIG. 11A, a silicon oxide film is formed on a semiconductor substrate 10 made of silicon as a first interlayer insulating film 11. Then, a $Ta_2O_5$ film 12 is formed on the first interlayer insulating film 11 by CVD (Chemical Vapor Deposition) as a capacitor insulating film. Then, a TiN film 13 is formed on the $Ta_2O_5$ film 12 by CVD or PCD (Physical Vapor Deposition) as a top electrode.

Subsequently, as shown in FIG. 11B, a resist pattern 14 having an opening 14a is formed on the TiN film 13 by a common lithography technique.

Then, as shown in FIG. 11C, the TiN film 13 and the $Ta_2O_5$ film 12 are dry-etched by a common technique using the resist pattern 14 as a mask. For example, the etching is carried out by RIE (Reactive Ion Etching) using $CF_4$ as etching gas at a flow rate of 20 ml/min (standard conditions) under pressure of 1.5 Pa and high frequency power of 600 W. Thereafter, the resist pattern 14 used as the mask is removed by ashing using $O_2$ gas at 200° C., for example.

In this manner, an opening 20 penetrating the TiN film 13 and the $Ta_2O_5$ film 12 is formed to expose part of the first interlayer insulating film 11. At this time, an organic residue 15 remains in the opening 20. Further, as detailed later, a deposit 16 may be generated in the opening 20.

Then, as shown in FIG. 11D, the remainder (not shown) of the resist pattern 14 and the organic residue 15 in the opening 20 are removed by cleaning. For example, the cleaning is carried out using a polymeric cleaning solution containing amine at 70° C. for 5 minutes.

The polymeric cleaning solution containing amine is a polymeric cleaning solution which is used for cleaning semiconductor substrates including metal films and contains mainly amine, a chelating agent, a pH adjuster and the like. Although APM (ammonium hydrogen peroxide mixture: $NH_4OH/H_2O_2$) is well known as a cleaning solution for the semiconductor substrates, APM is not included in the amine-containing polymeric cleaning solution mentioned herein. If SPM (sulfuric acid-hydrogen peroxide mixture: $H_2SO_4/H_2O_2$) is used as the cleaning solution, $H_2O_2$ contained therein oxidizes and dissolves the metal film. Therefore, SPM cannot be used in this step.

Even through this step, the deposit 16 is not removed and remains as it is.

Then, as shown in FIG. 12A, a silicon oxide film is formed on the TiN film 13 by CVD as a second interlayer insulating film 17. The second interlayer insulating film 17 fills the opening 20, thereby burying the deposit 16 below the second interlayer insulating film 17.

Then, as shown in FIG. 12B, the second interlayer insulating film 17 which filled the opening 20 is subjected to dry etching or the like to form a contact hole 17a reaching the semiconductor substrate 10.

The contact hole 17a is formed so as not to contact the TiN film 13 and the $Ta_2O_5$ film 12. However, if the deposit 16 exists, the deposit 16 may be exposed in the contact hole 17a.

Then, as shown in FIG. 12C, tungsten is deposited by CVD to fill the contact hole 17a, thereby forming a contact plug 18. If the deposit 16 is exposed in the contact hole 17a, the contact plug 18 comes into contact with the deposit 16.

In this manner, the conventional capacitor is formed.

In the step shown in FIG. 11C, halogen-based gas is generally used to dry-etch films containing refractory metal such as the TiN film 13 and the $Ta_2O_5$ film 12. At this time, if fluorine-based gas is used and left as it is after the etching, the fluorine remainder reacts with metal, thereby generating metal fluoride as the deposit 16.

For example, Japanese Unexamined Patent Publication No. H6-151383 proposes a method for removing alkali metal fluorides or alkaline-earth metal fluorides remaining on the semiconductor substrate by oxidation using oxygen plasma or an oxidant solution. Therefore, if the deposit generated is alkali metal fluoride or alkaline-earth metal fluoride, the deposit 16 is removed from the resulting capacitor, unlike the one as shown in FIG. 12C.

SUMMARY OF THE INVENTION

As a means for improving properties of devices in a semiconductor integrated circuit combined with DRAMs, the $Ta_2O_5$ film and the TiN film have been used as the capacitor insulating film and the top electrode, respectively, as described above. In this case, if the opening 20 is formed in the TiN film 13 and the $Ta_2O_5$ film 12 by dry etching using fluorine-based gas, a titanium fluoride-based deposit 16 is generated as shown in FIG. 11C. The deposit 16 is a product of a reaction between titanium in the TiN film 13 and fluorine remaining on the semiconductor substrate 10 and expressed as TiFx (x is 1 or more and 3 or less). "TiFx" appears throughout the specification is the same as the one described above even if no particular description is given.

Unlike the deposit mainly composed of alkali metal fluoride or alkaline-earth metal fluoride, the titanium-based deposit 16 cannot be removed by the conventional treatment with oxygen plasma or an oxidant solution performed on the surface of the semiconductor substrate 10. Further, even if the semiconductor substrate is cleaned using a common polymeric cleaning solution, the deposit 16 cannot be removed and remains as shown in FIG. 11D.

Since the deposit 16 remains in the obtained capacitor as shown in FIG. 12C, the deposit 16 brings about a short between the TiN film 13 as the top electrode and the contact plug 18 formed by filling the contact hole 17a in the second interlayer insulating film 17 with tungsten.

In view of the above problem, an object of the present invention is to allow removal of a deposit mainly composed of metal fluoride generated during the steps of manufacturing capacitors of semiconductor devices, thereby reducing the occurrence of failure in electronic elements.

To achieve the above object, the present invention provides a first method for manufacturing an electronic device comprising the steps of: dry-etching a Ti-containing metal film formed on a substrate with a gas containing fluorine; and treating the substrate with a chemical solution containing fluorine ions after the dry etching step.

When a Ti-containing metal film is patterned by dry etching using a gas containing fluorine, a deposit is generated. However, the deposit is removed by the first method for manufacturing the electronic device. The deposit is mainly composed of TiFx (x is 1 to 3) and dissolved away from the substrate by treating the substrate with a chemical solution containing fluorine ions. TiO, which constitutes the surface of the deposit, is also dissolved away in the same manner.

The chemical solution is preferably an aqueous solution containing 0.1 mass % or more of hydrofluoric acid.

By so doing, the deposit is surely dissolved in the chemical solution and removed from the substrate.

The step of treating the substrate with the chemical solution preferably includes the step of reducing electron density at the surface of the substrate.

If the electron density at the surface of the substrate is reduced, the fluorine ions in the chemical solution are easily adsorbed onto the substrate. That is, since the fluorine ions carry negative charges as expressed as $F^-$, they are easily adsorbed onto the surface of the substrate when the density of electrons, which are negative charges, is reduced at the substrate surface. As a result, the deposit is dissolved into the chemical solution at a higher reaction rate. Thus, the deposit is removed away from the substrate in a short time.

It is preferable that the chemical solution used to treat the substrate to reduce the electron density at the surface of the substrate has hydrogen ion concentration pH of 1 or less.

If the hydrogen ion concentration pH of the chemical solution is 1 or less, the electron density at the surface of the substrate is surely reduced by treating the substrate with the chemical solution. Therefore, the fluorine ions contained in the chemical solution are easily adsorbed onto the surface of the deposit, thereby dissolving the deposit in the chemical solution with ease.

It is preferred that the chemical solution used to treat the substrate to reduce the electron density at the surface of the substrate contains hydrochloric acid.

Since hydrochloric acid contained in the chemical solution supplies hydrogen ions, the electron density at the surface of the substrate is surely reduced. As a result, the deposit is dissolved in the chemical solution at a higher reaction rate.

It is preferred that the chemical solution contains hydrochloric acid to have hydrogen ion concentration pH of 1 or less.

By so doing, the chemical solution contains fluorine ions and has hydrogen ion concentration pH of 1 or less. Therefore, the rate of dissolving the deposit in the chemical solution is surely increases.

It is preferable that the method further comprises the step of reducing the electron density at the surface of the substrate after the dry etching step and before the step of treating the substrate with the chemical solution.

Since the density of electrons having negative charges has been reduced at the substrate surface, the fluorine ions having negative charges are easily adsorbed onto the surface of the substrate during the treatment with the chemical solution. As a result, the deposit is dissolved in a short time and removed away from the substrate.

The chemical solution containing fluorine ions dissolves the deposit, but at the same time, it may cause damage to the substrate and the like. Therefore, the treatment with the chemical solution containing the fluorine ions is preferably performed in a short time.

If the substrate is treated to reduce the electron density at the surface of the substrate, time required for the treatment with the chemical solution is reduced.

It is preferred that the electron density at the surface of the substrate is reduced by treating the surface of the substrate with hydrochloric acid.

By so doing, hydrogen ions are first adsorbed on the surface of the deposit by the treatment with hydrochloric acid. Then, if the treatment with the chemical solution containing fluorine ions is performed in this state, the fluorine ions are adsorbed quickly onto the surface of the deposit because the hydrogen ions have been adsorbed on the surface of the deposit.

It is preferred that a voltage is applied to the substrate to reduce the electron density at the surface of the substrate.

By the voltage application, the electron density at the surface of the substrate is reduced. Therefore, during the following treatment with the chemical solution, the fluorine ions are quickly adsorbed onto the surface of the deposit. As a result, the deposit is dissolved away from the substrate in a short time.

To achieve the above-described object, a second method for manufacturing an electronic device according to the present invention comprising the steps of: dry-etching a Ti-containing metal film formed on a substrate with a first gas containing fluorine; treating the substrate with plasma of a second gas containing fluorine after the dry etching step; and treating the surface of the substrate with water or an aqueous solution after the plasma treatment step.

According to the second method for manufacturing the electronic device, the deposit mainly composed of TiFx which is generated during the step of dry-etching a Ti-containing metal film with a first gas containing fluorine is converted into $TiF_5$ or $TiF_6$ by treating with plasma of a second gas containing fluorine. Since TiFx which is insoluble in water is converted into $TiF_5$ or $TiF_6$ which is soluble in water, the deposit is removed by treating the surface of the substrate with water or an aqueous solution after the plasma treatment using the second gas.

The second gas containing fluorine is preferably a gas containing $NF_3$.

By so doing, TiFx as the deposit is surely converted into $TiF_5$ or $TiF_6$. Therefore, the deposit is surely removed by the following treatment with water or an aqueous solution.

To achieve the above-described object, a third method for manufacturing an electronic device according to the present invention comprises the steps of: dry-etching a Ti-containing metal film formed on a substrate with a gas containing fluorine; treating the substrate with gaseous HF diluted with inert gas after the dry etching step; and treating the surface of the substrate with water or an aqueous solution after the treatment with the gaseous HF.

According to the third method for manufacturing the electronic device, the deposit mainly composed of TiFx which is generated during the step of dry-etching a Ti-containing metal film with a first gas containing fluorine is converted into $TiF_5$ or $TiF_6$ through treatment with gaseous HF diluted with inert gas. Since TiFx which is insoluble in water is converted into $TiF_5$ or $TiF_6$ which is soluble in water, the deposit is removed by treating the surface of the substrate with water or an aqueous solution.

It is preferred that the gaseous HF diluted with the inert gas has a HF concentration of 0.1 mass % or more and 4.0 mass % or less.

By so doing, damage to the TiN film, if formed on the substrate, is controlled and the deposit is removed with reliability.

As described above, according to the method for manufacturing the electronic device of the present invention, the deposit containing TiFx generated on the substrate is removed by treatment with a chemical solution containing fluorine ions, treatment with plasma of a fluorine-containing gas or treatment with gaseous HF diluted with inert gas. Therefore, even if a metal film containing Ti is formed and patterned by dry etching using fluorine-based gas in the course of the manufacture of the electronic device, defects such as a short caused by the deposit are prevented from occurring, thereby reducing the occurrence of failure in electronic elements such as semiconductor elements. Thus, the present invention is useful in improving manufacturing yield.

BRIEF DESCRIPTION OF THE DRAWINGS

FIG. 8A shows a treatment apparatus used for treatment with gaseous HF and FIG. 8B shows a rinsing apparatus used for rinsing treatment.

DETAILED DESCRIPTION OF THE INVENTION

Embodiment 1

Hereinafter, with reference to the drawings, an explanation is given of Embodiment 1 of the present invention.

FIGS. 1A to 1D and FIGS. 2A to 2D illustrate the steps of a method for manufacturing an electronic device according to Embodiment 1 of the present invention. In this embodiment, a semiconductor device is fabricated as the electronic device.

Figure 1A:
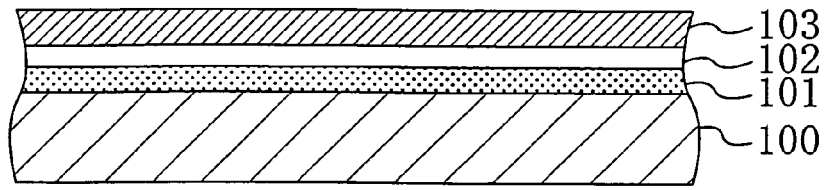
FIGS. 1A to 1D are views illustrating the steps of a method for manufacturing an electronic device according to Embodiments 1 to 6 of the present invention.

First, as shown in FIG. 1A, a silicon oxide film is formed on a semiconductor substrate 100 made of silicon by CVD as a first interlayer insulating film 101. Then, a $Ta_2O_5$ film 102 is formed on the first interlayer insulating film 101 by CVD as a capacitor insulating film. Further, a TiN film 103 is formed on the $Ta_2O_5$ film 102 by CVD or PVD as a top electrode.

Figure 1B:
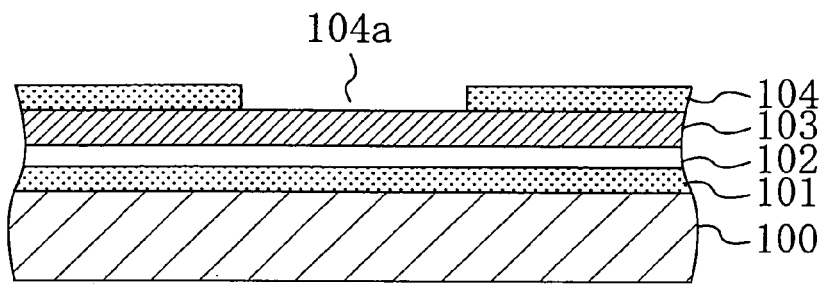

Then, as shown in FIG. 1B, a resist pattern 104 having an opening 104a is formed on the TiN film 103 by a common lithography technique.

Figure 1C:
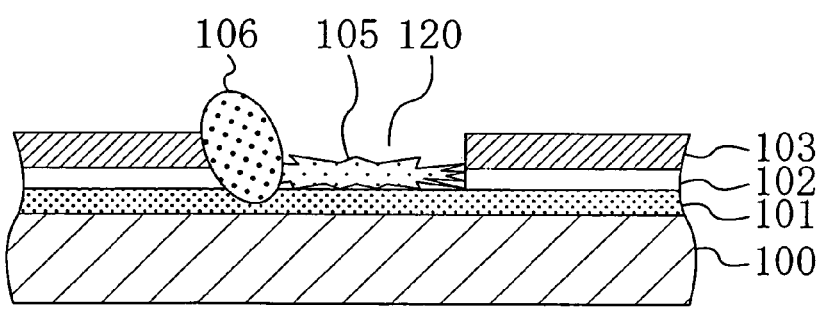

Then, using the resist pattern 104 as a mask, the TiN film 103 and the $Ta_2O_5$ film 102 are dry-etched by a common technique as shown in FIG. 1C. More specifically, the etching is carried out by RIE using $CF_4$ as etching gas at a flow rate of 20 ml/min (standard conditions) under pressure of 1.5 Pa and high frequency power of 600 W. Thereafter, the resist pattern 104 used as a mask is removed by ashing using $O_2$ gas at 200° C.

In this manner, an opening 120 penetrating the TiN film 103 and the $Ta_2O_5$ film 102 is formed to expose part of the first interlayer insulating film 101. At this time, an organic residue 105 remains in the opening 120.

When the etching is carried out using etching gas containing fluorine (F) such as $CF_4$, F contained in the etching gas remains and reacts with Ti contained in the TiN film 103, thereby generating a deposit 106 containing TiFx (x is 1 or more and 3 or less). The deposit 106 cannot be removed even by the ashing described above.

Figure 1D:
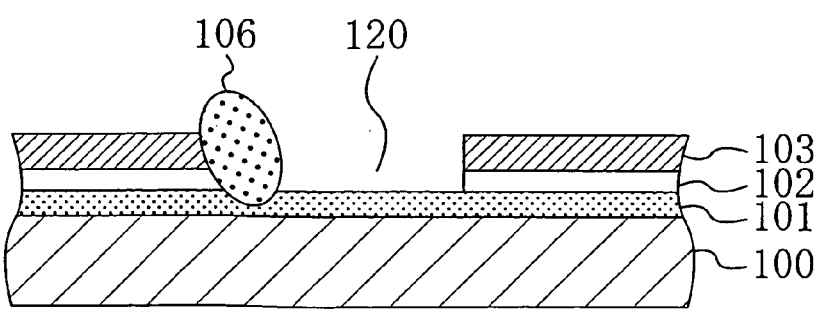

Then, as shown in FIG. 1D, the remainder of the resist pattern 104 (not shown) and the organic residue 105 remaining in the opening 120 are removed by cleaning. For example, the cleaning is carried out by batch spray cleaning using a polymeric cleaning solution containing amine at a flow rate of 10 l/min at 70° C. for 5 minutes. Or alternatively, the cleaning may be carried out in a single-wafer cleaning apparatus using a polymeric cleaning solution containing amine a flow rate of 1 l/min, 70° C. and 1,000 rpm and for 30 seconds. How to clean the substrate is not particularly limited.

Even through the cleaning step, the deposit 106 is not removed but remains as it is.

Figure 2A:
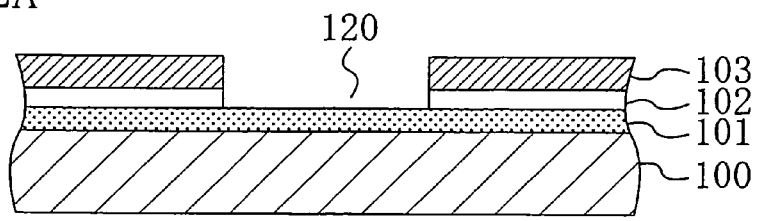
FIGS. 2A to 2D are views illustrating the steps of the method for manufacturing the electronic device according to Embodiments 1 to 6 of the present invention.

The deposit 106 is removed as shown in FIG. 2A. In this embodiment, as described later in detail, a chemical solution containing 0.1 mass % or more of HF is used for the removal.

Figure 2B:
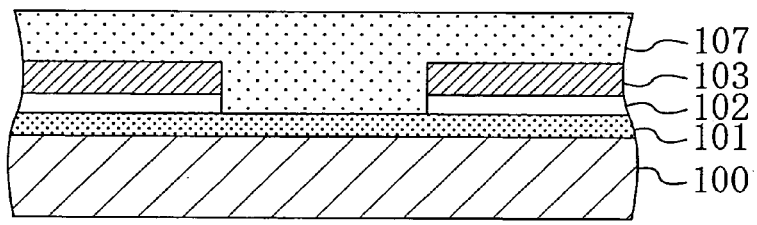

Then, as shown in FIG. 2B, a silicon oxide film is formed on the TiN film 103 by CVD as a second interlayer insulating film 107. The second interlayer insulating film 107 fills the opening 120.

Figure 2C:
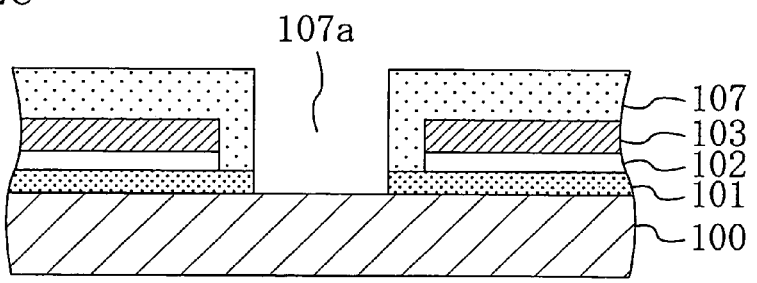

Then, as shown in FIG. 2C, the second interlayer insulating film 107 which filled the opening 120 is subjected to dry etching to form a contact hole 107a reaching the semiconductor substrate 100. At this time, the contact hole 107a is formed so as not to contact the TiN film 103 and the $Ta_2O_5$ film 102.

Figure 2D:
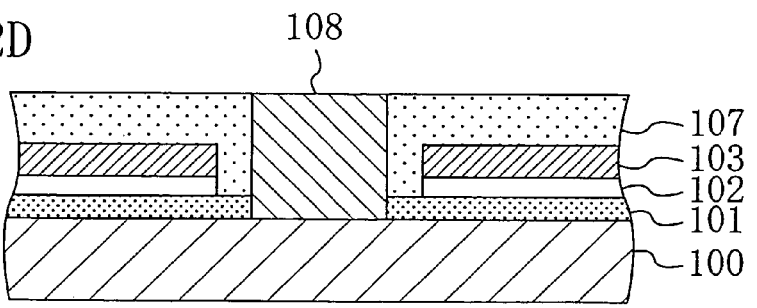

Then, as shown in FIG. 2D, tungsten is deposited by CVD to fill the contact hole 107a, thereby forming a contact plug 108.

In this manner, a semiconductor device is manufactured. Since the deposit 106 has been removed, there is no possibility of causing a short between the TiN film 103 as the top electrode and the contact plug 108 due to the existence of the deposit 106.

Then, an explanation is given of the step of removing the deposit 106 as shown in FIG. 2A.

Figure 3A:
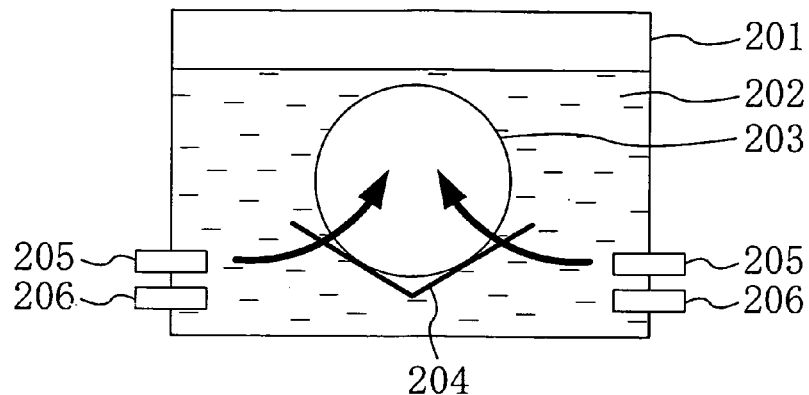
FIGS. 3A to 3C are views illustrating a batch-type single bath cleaning apparatus used in Embodiments 1 to 3 of the present invention and a method for removing a deposit with the apparatus.
Figure 3B:
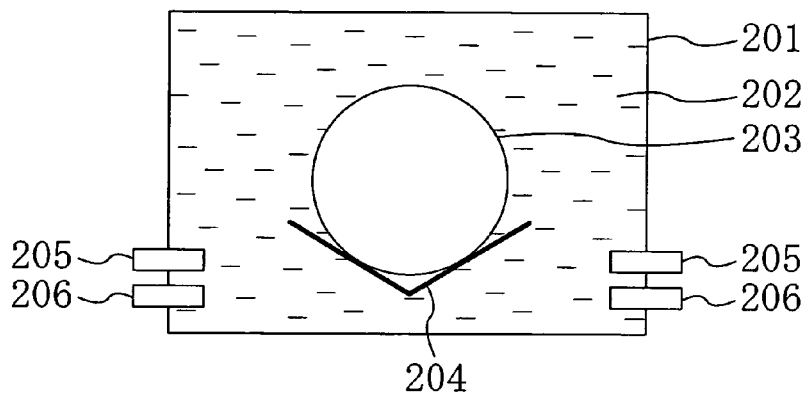
Figure 3C:
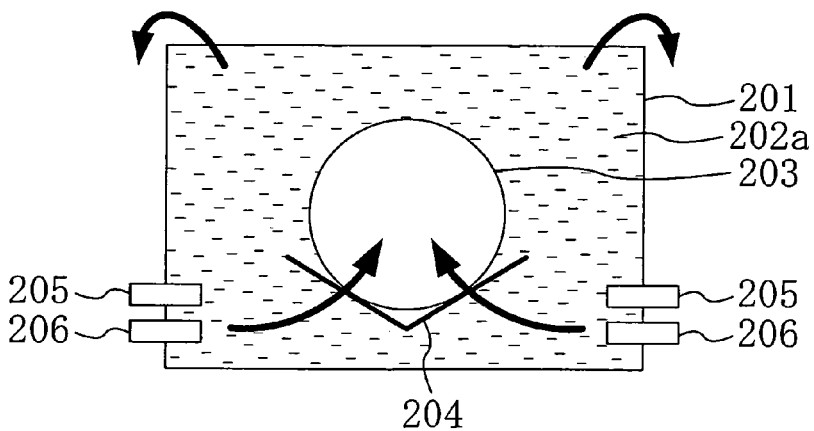

FIGS. 3A to 3C illustrate the steps of removing the deposit 106 using a batch-type single bath cleaning apparatus.

As shown in FIGS. 3A to 3C, the cleaning apparatus includes a cleaning bath 201 containing a chemical solution 202 and is so configured that a semiconductor substrate 203 is placed on a substrate support 204 provided in the cleaning bath 201. At the bottom of the cleaning bath 201, at least one chemical solution feed nozzle 205 and at least one pure water feed nozzle 206 are provided (the nozzles are provided in pairs, respectively, in the apparatus shown in FIGS. 3A to 3C).

The semiconductor substrate 203 is, for example, a semiconductor substrate which has gone through the steps before the step of FIG. 1D and on which the deposit 106 has been generated.

To remove the deposit 106 using the above-described cleaning apparatus, first, a chemical solution 202 containing 0.1 mass % or more of HF is fed from the chemical solution feed nozzle 205 into the cleaning bath 201 in which the semiconductor substrate 203 has been placed. More specifically, the chemical solution is DHF (diluted hydrofluoric acid) prepared in the ratio of HF:$H_2O$=1:500. At this time, DHF flows in a direction indicated by arrows.

Then, as shown in FIG. 3B, the semiconductor substrate 203 is kept immersed in DHF for 30 seconds, for example. By so doing, the deposit 106 is dissolved in DHF and removed.

Then, as shown in FIG. 3C, pure water 202a is fed into the cleaning bath 201 from the pure water feed nozzle 206 provided at the bottom of the cleaning bath 201. At this time, pure water is fed in an amount over the volume of the cleaning bath 201, thereby discharging DHF contained in the cleaning bath 201 from the top of the cleaning bath 201.

In this manner, the deposit 106 generated on the semiconductor substrate is removed. Hereinafter, an explanation is given of how the removal is achieved, i.e., how the chemical solution containing fluorine ions removes the deposit 106.

Figure 4A:
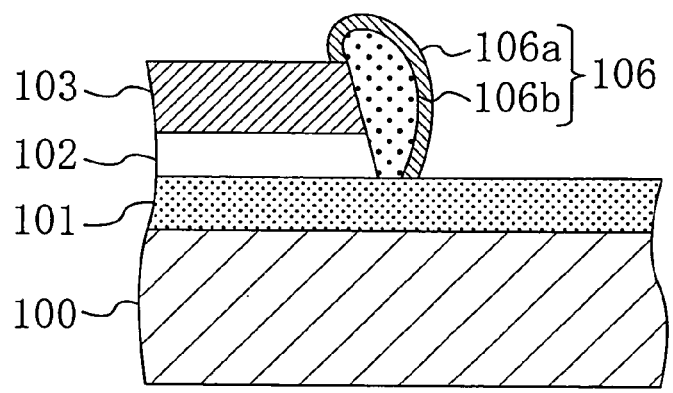
FIGS. 4A to 4C are views illustrating the deposit and the steps of removing the deposit.
Figure 4B:
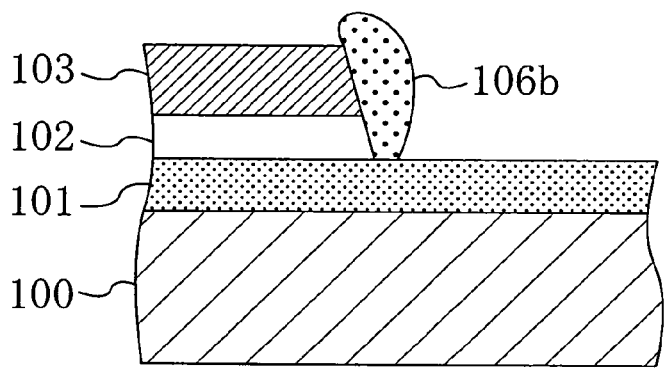
Figure 4C:
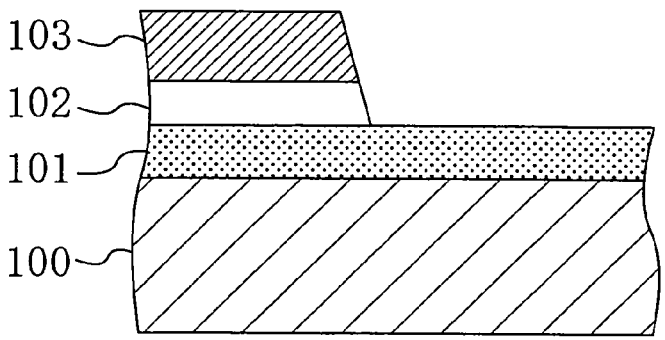

FIGS. 4A to 4C are schematic views illustrating the deposit 106 generated on the semiconductor substrate 100 and the step of removing the deposit 106 generated on the semiconductor substrate 100.

As shown in FIG. 4A, the deposit 106 is generated to contact the first interlayer insulating film 101, the side surface of the $Ta_2O_5$ film 102 and the TiN film 103. The deposit 106 is composed of a TiO outer layer 106a and a TiFx part 106b covered with the TiO outer layer 106a.

Therefore, the TiO outer layer 106a is first dissolved away as shown in FIG. 4B and then the TiFx part 106b is removed as shown in FIG. 4C.

Figures 9, 10:
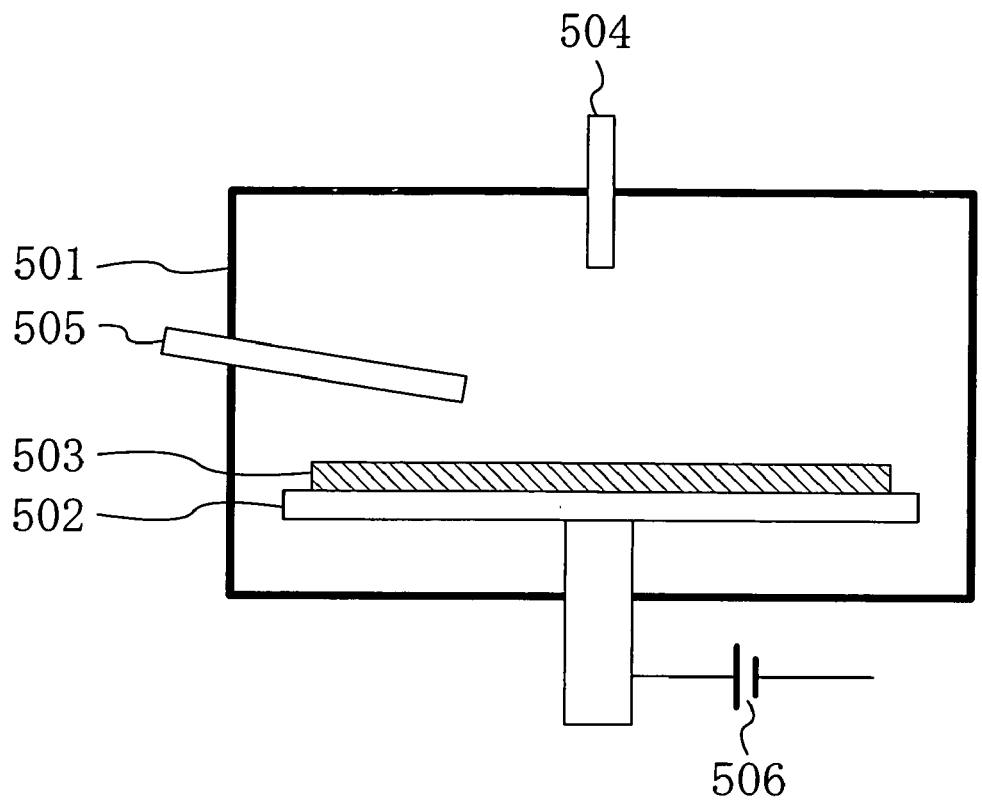
FIG. 9 is a view illustrating the structure of a treatment apparatus used for removing the deposit according to the method for manufacturing the electronic device of Embodiment 6 of the present invention.
FIG. 10 shows an equation of a reaction between titanium and fluorine ion.
Figure 11A:
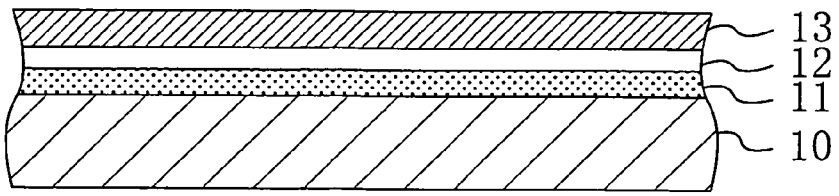
FIGS. 11A to 11D are views illustrating the steps of a conventional method for manufacturing a semiconductor device.
Figure 11B:
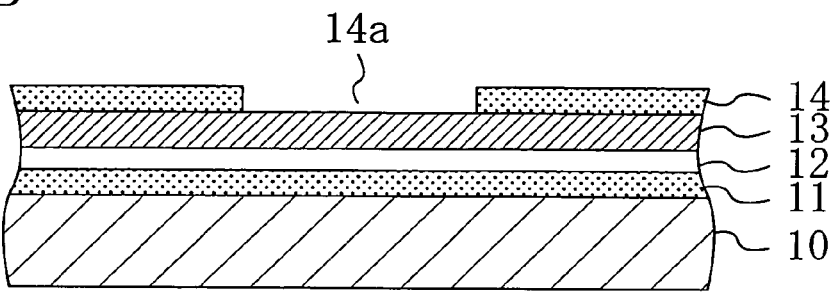
Figure 11C:
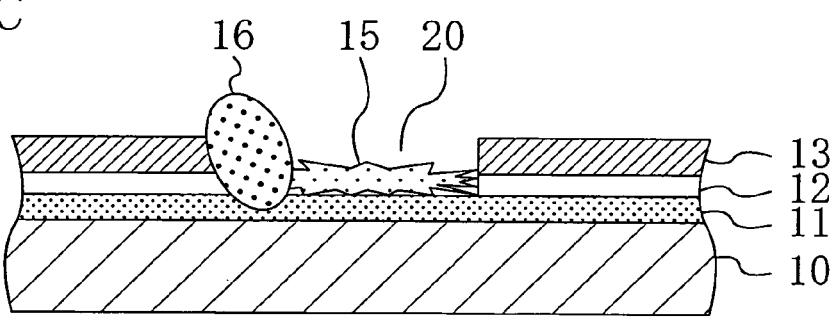
Figure 11D:
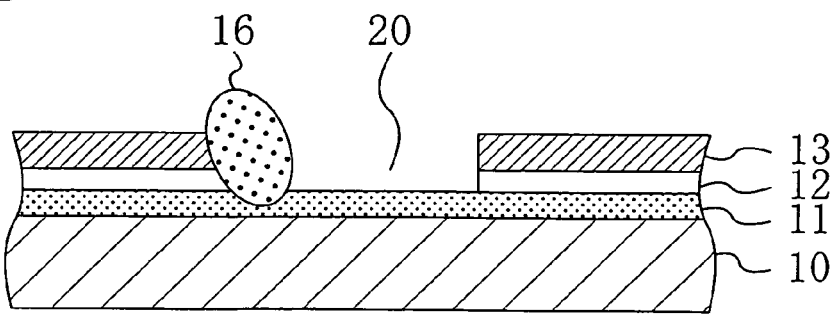
Figure 12A:
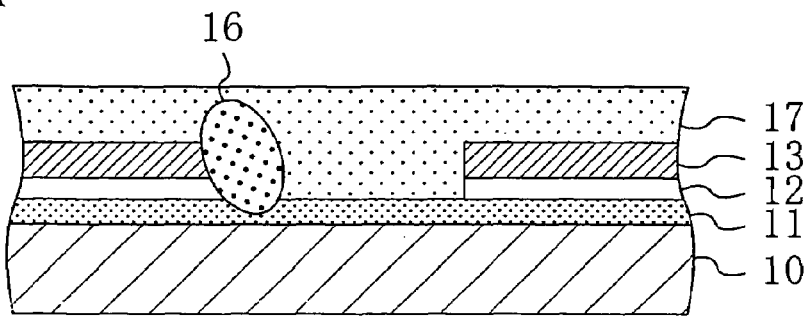
FIGS. 12A to 12C are views illustrating the steps of the conventional method for manufacturing the semiconductor device.
Figure 12B:
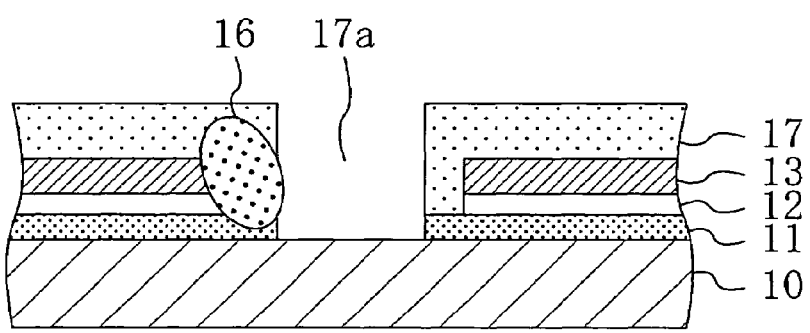
Figure 12C:
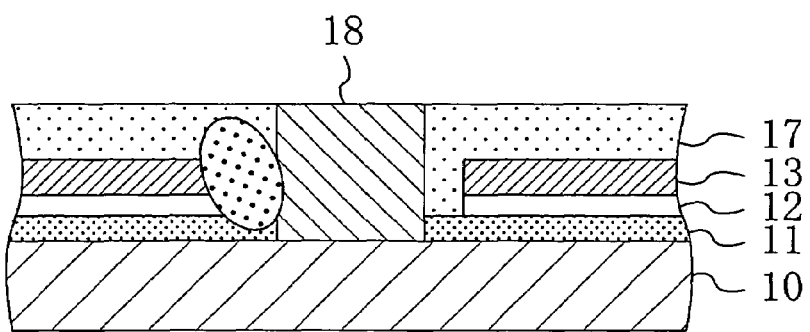

FIG. 10 shows an equation of the reaction between titanium and fluorine ions contained in the chemical solution.

It is considered that TiFx (x is 1 to 3), which is a solid hardly soluble-in-water, is converted into $TiF_6^{2-}$ by feeding more fluorine ions $F^-$ and then dissolved away. An oxidation-reduction potential in this reaction is −1.191 V, whereas hydrofluoric acid has an oxidation-reduction potential of about 0.7 to 1.0 V. Therefore, by cleaning with hydrofluoric acid, the reaction product is further oxidized and converted into $TiF_6^{2-}$, and then dissolved away.

TiO is also converted into $TiF_6^{2-}$ by feeding $F^-$ and then dissolved away.

Figure 5:
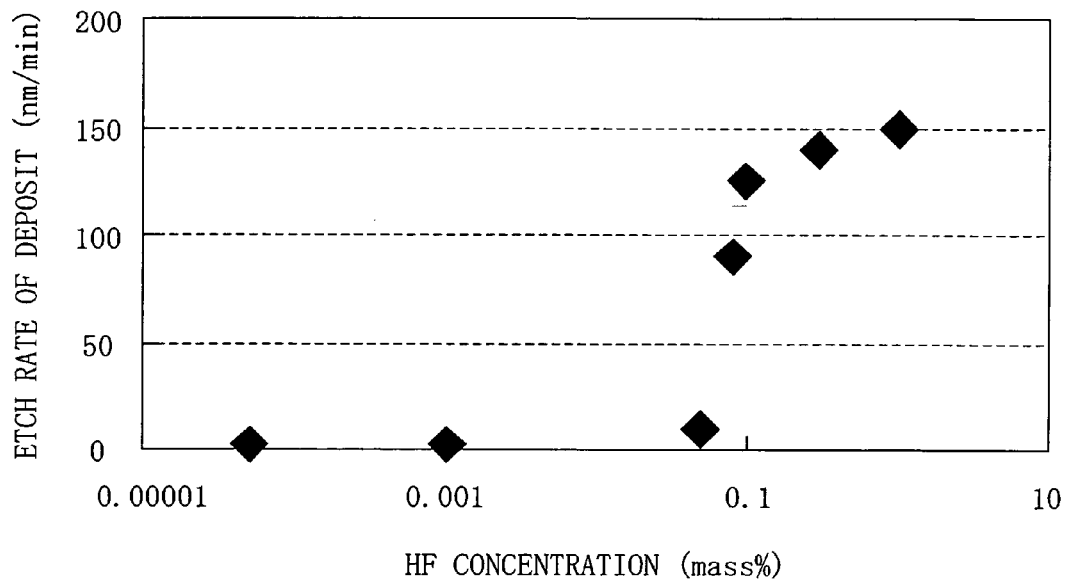
FIG. 5 is a graph illustrating a relationship between the concentration of HF in a chemical solution used for removing the deposit and the etch rate of the deposit.

The equation and the oxidation-reduction potential show that TiFx and TiO are converted into $TiF_6^{2-}$ and dissolved away in the presence of HF. Referring to FIG. 5, the concentration of HF in the solution and the etch rate of the deposit establish a certain relationship. More specifically, when the HF concentration is lower than 0.1 mass %, the etch rate of the deposit 106 is very low. On the other hand, when the HF concentration reaches 0.1 mass % or more, the etch rate suddenly increases.

In view of the relationship, it is assumed that the dissolution of the TiO outer layer 106a determines the etch rate of the deposit 106. That is, the TiO outer layer 106a which is harder to dissolve than the TiFx part 106b must be dissolved away first. Then, after the TiO outer layer 106a has been removed, the TiFx part 106b is quickly removed. Thus, it is understood that the deposit 106 is preferably removed by treatment with a chemical solution containing 0.1 mass % or more of HF.

A consideration on the upper limit of the HF concentration in the chemical solution used for removing the deposit 106 is described below.

When the semiconductor substrate is treated with DHF to remove the deposit 106, the first interlayer insulating film 101 is also dissolved together with the deposit 106. Depending on the structure and properties of semiconductor elements to be manufactured, an allowable etch amount of the first interlayer insulating film 101 varies (an etch amount up to which serious influence is not caused on the properties of the semiconductor elements during the removal of the deposit 106). Therefore, if precision in processing the semiconductor elements permits, the HF concentration may be increased. On the other hand, if the precision does not permit, the HF concentration must be reduced and therefore the treatment is carried out with a low concentration chemical solution containing 0.1 mass % or around. In this way, the upper limit of the HF concentration must be determined case by case depending on the conditions.

As described above, according to the method for manufacturing the electronic device of the present invention, the deposit 106 is removed by treatment using the chemical solution containing fluorine such as DHF. This prevents the occurrence of defects such as a short caused by the deposit, thereby reducing the occurrence of failure in the semiconductor elements.

Further, the etching selective ratio between the TiN film 103 and the deposit 106 is about 4,000 when the HF concentration is 0.1 mass %, for example. Therefore, the treatment for removing the deposit 106 is carried out while the TiN film 103 is hardly etched.

In this embodiment, the deposit 106 is removed using the batch-type single bath cleaning apparatus. However, a single-wafer cleaning apparatus or other cleaning apparatuses may also be used.

Embodiment 2

Now, with reference to the drawings, an explanation is given of Embodiment 2 of the present invention.

FIGS. 1A to 1D and FIGS. 2A to 2D illustrate the steps of a method for manufacturing an electronic device according to Embodiment 2 of the present invention. Embodiment 2 is different from Embodiment 1 in the step of removing the deposit 106 corresponding to FIG. 2A. Therefore, in this embodiment, the removal step is described in detail and an explanation of the other steps same as those of Embodiment 1 is omitted.

Also in this embodiment, a batch-type single bath cleaning apparatus as shown in FIGS. 3A to 3C is used to remove the deposit 106 in the same manner. What is different from Embodiment 1 is the chemical solution used. That is, the chemical solution used in Embodiment 2 contains, in addition to 0.1 mass % or more of HF as described in Embodiment 1, hydrogen ions at a high concentration to have pH of 1 or less. Examples of such a chemical solution includes a chemical solution containing 0.1 mass % of HF and 0.9 mass % of hydrochloric acid. Hereinafter, the step of removing the deposit 106 of this embodiment is explained.

First, as shown in FIG. 3A, a semiconductor substrate 203 is placed on a substrate support 204 provided in a cleaning bath 201. Then, a chemical solution 202 containing 0.1 mass % of HF and 0.9 mass % of hydrochloric acid is fed into the cleaning bath 201 through a chemical solution feed nozzle 205.

Then, as shown in FIG. 3B, the semiconductor substrate 203 is kept immersed in the chemical solution 202 for 30 seconds.

Then, as shown in FIG. 3C, pure water 202a is fed from a pure water feed nozzle 206 provided at the bottom of the cleaning bath 201. At this time, pure water is fed in an amount over the volume of the cleaning bath 201, thereby discharging the chemical solution 202 contained in the cleaning bath 201 from the top of the cleaning bath 201.

In this manner, the deposit 106 generated on the semiconductor substrate is removed. Hereinafter, an explanation is given of why the use of the chemical solution having pH of 1 or less is effective.

As described in Embodiment 1, TiFx, the deposit 106, is dissolved through the reaction with fluorine ions $F^-$ contained in the chemical solution. If acid is added to the chemical solution containing HF, the concentration of hydrogen ions in the chemical solution increases. Then, $H^+$ is adsorbed on the surface of the deposit and electron density at the surface of the deposit decreases. Since the electron density decreases to reduce electric repulsion and $H^+$ has been adsorbed on the surface of the deposit, $F^-$ is easily attracted to the surface of the deposit and adsorbed thereon.

In this way, use of the chemical solution of high hydrogen ion concentration allows an increase in reactivity, thereby removing the deposit with higher efficiency. In particular, a significant effect is exhibited by use of the chemical solution having pH of 1 or less.

Figure 6:
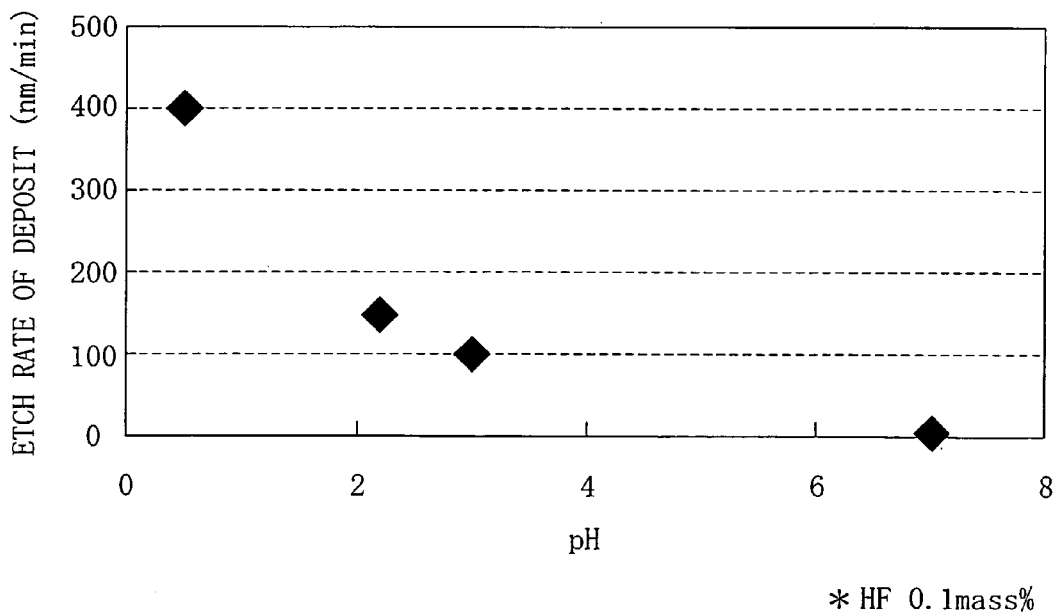
FIG. 6 is a graph illustrating a relationship between the concentration of hydrogen ions in the chemical solution used for removing the deposit and the etch rate of the deposit.

FIG. 6 shows a relationship between pH and the etch rate of the deposit when the HF concentration is 0.1 mass %. As apparent from the figure, the etch rate increases with a decrease in pH while the HF concentration is kept constant. For example, if hydrochloric acid is added to the chemical solution containing 0.1 mass % of HF in a concentration of 0.9 mass %, pH 2.2 of the chemical solution containing HF only decreases to pH 0.4 and the etch rate of the deposit increases from 150 nm/min to 400 nm/min.

As described above, in this embodiment, time required for removing the deposit is reduced by increasing the hydrogen ion concentration in the chemical solution without increasing the HF concentration. Further, since the treatment time is reduced, the etch amount of the first interlayer insulating film 101 is reduced. Therefore, fine patterning is carried out with improved precision.

Also in this embodiment, other cleaning apparatuses than the batch-type single bath cleaning apparatus may also be used for the removal of the deposit 106.

In order to increase the hydrogen ion concentration in the chemical solution, other acids than hydrochloric acid may be used. However, sulfuric acid, for example, must be used at high temperatures because it is highly viscous. Further, if nitric acid is used in combination with hydrofluoric acid, silicon is undesirably etched. Therefore, among various common acids, it is preferred to use hydrochloric acid.

Embodiment 3

Now, with reference to the drawings, an explanation is given of Embodiment 3 of the present invention.

FIGS. 1A to 1D and FIGS. 2A to 2D illustrate the steps of a method for manufacturing an electronic device according to Embodiment 3 of the present invention. Embodiment 3 is different from Embodiment 1 in the step of removing the deposit 106 corresponding to FIG. 2A. Therefore, in this embodiment, the removal step is described in detail and an explanation of the other steps same as those of Embodiment 1 is omitted.

Also in this embodiment, the batch-type single bath cleaning apparatus shown in FIGS. 3A to 3C is used in the step of removing the deposit 106, but the chemical solution used and how to remove the deposit are different from Embodiment 1. Hereinafter, an explanation is given of the step of removing the deposit 106 in this embodiment.

First, as shown in FIG. 3A, the semiconductor substrate 203 is placed on the substrate support 204 in the cleaning bath 201. The semiconductor substrate 203 has gone through the steps before the step shown in FIG. 1D. The first interlayer insulating film 101, $Ta_2O_5$ film 102, TiN film 103 and the like have been formed thereon and the deposit 106 has been generated thereon.

Then, hydrochloric acid is fed from the chemical solution feed nozzle 205 to fill the cleaning bath 201. Then, DHF (diluted hydrofluoric acid) prepared in the ratio of $HF:H_2O=1:500$ is fed into the cleaning bath 201 in an amount over the volume of the cleaning bath 201. As a result, hydrochloric acid which has been first introduced into the cleaning bath 201 is all discharged from the top of the cleaning bath 201 on an upward flow and the cleaning bath 201 is filled with DHF. Thereafter, as shown in FIG. 3B, the semiconductor substrate 203 is kept immersed in DHF for 30 seconds including time required for feeding DHF.

Then, as shown in FIG. 3C, pure water 202a is fed into the cleaning bath 201 through the pure water feed nozzle 206 to rinse the semiconductor substrate 203.

In this manner, the deposit 106 generated on the semiconductor substrate is removed. Hereinafter, an explanation is given of the effect caused by feeding DHF after immersing the semiconductor substrate into hydrochloric acid.

When hydrochloric acid is fed into the cleaning bath 201, pH in the cleaning bath 201 is reduced uniformly. Therefore, electron density at the surface of the semiconductor substrate 203 placed on the cleaning bath 201 is reduced uniformly.

As described in Embodiment 2, when DHF is fed into the cleaning bath with the electron density at the surface of the substrate reduced, fluorine ions $F^-$ are easily adsorbed onto the surface of the deposit 106, thereby removing the deposit 106 with efficiency. Further, in this embodiment, since the electron density at the surface of the semiconductor substrate 203 has been reduced, the deposit 106 is removed more uniformly from the surface of the substrate 203.

In this embodiment, DHF prepared in the ratio of HF:$H_2O$=1:500 is used as the chemical solution for removing the deposit 106. However, this is not essential. In the same manner as in Embodiment 1, the effect of this embodiment is surely obtained as long as the chemical solution used contains 0.1 mass % or more of HF and does not decrease the precision in processing the semiconductor element to be manufactured.

As the chemical solution used after the immersion of the substrate 203 into hydrochloric acid, a solution mixed with hydrochloric acid to increase the hydrogen ion concentration may be used in the same manner as Embodiment 2. For example, a chemical solution containing 0.7 mass % of hydrochloric acid and 0.1 mass % of HF may be used. In this case, the effect of this embodiment is surely obtained as long as the chemical solution used shows pH of 1 or less, contains 0.1 mass % or more of HF and does not decrease the precision in processing the semiconductor element to be manufactured.

Also in this embodiment, other cleaning apparatuses than the batch-type single bath cleaning apparatus may be used to remove the deposit 106.

Embodiment 4

Now, with reference to the drawings, an explanation is given of Embodiment 4 of the present invention.

FIGS. 1A to 1D and FIGS. 2A to 2D illustrate the steps of a method for manufacturing an electronic device according to Embodiment 4 of the present invention. Embodiment 4 is different from Embodiment 1 in the step of removing the deposit 106 corresponding to FIG. 2A. Therefore, in this embodiment, the removal step is described in detail and an explanation of the other steps same as those of Embodiment 1 is omitted.

In this embodiment, the deposit 106 is removed by plasma treatment using $NF_3$ gas and the following rinsing treatment.

Figure 7:
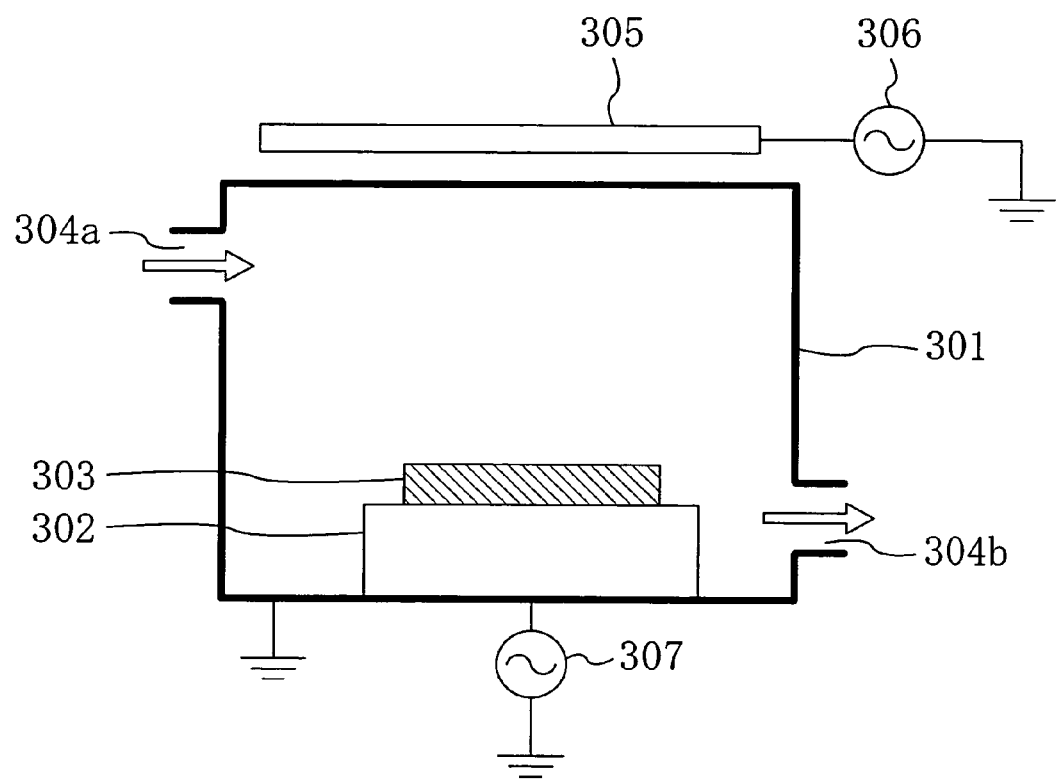
FIG. 7 is a view illustrating the structure of a plasma treatment apparatus used for removing the deposit according to the method for manufacturing the electronic device of Embodiment 4 of the present invention.

FIG. 7 is a schematic view illustrating an example of a plasma treatment apparatus used in this embodiment.

The plasma treatment apparatus includes a sample stage 302 provided in a chamber 301 so that a semiconductor substrate 303 is placed thereon. The chamber 301 is provided with an inlet 304a and an outlet 304b so that gas is introduced into the chamber 301 through the inlet 304a and discharged out of the chamber 301 through the outlet 304b.

A top electrode 305 is provided above the chamber 301 and first high frequency power is applied thereto from a first high frequency power supply 306 connected to the top electrode 305.

Further, a second high frequency power supply 307 is connected to the sample stage 302 and second high frequency power is applied thereto.

With the thus configured plasma treatment apparatus, the semiconductor substrate 303 which has gone through the steps before the step shown in FIG. 1D and on which the deposit 106 has been generated is treated with plasma.

More specifically, first, the semiconductor substrate 303 is placed on the sample stage 302.

Then, for example, $NF_3$ gas is introduced from the inlet 304a at a flow rate of 100 ml/min (standard conditions) under pressure of 133 Pa. A high frequency power of 600 W is applied from the first high frequency power supply 306 and a high frequency power of 100 W is applied from the second high frequency power supply 307. In this way, plasma treatment is carried out for 30 seconds. However, the above-described plasma treatment conditions are merely an example and have been established without any particular limitation.

Through this treatment, TiFx (x is 1 to 3) which is a component of the deposit 106 and fluorine contained in the plasma of the $NF_3$ gas produce $TiF_5$ or $TiF_6$ which is soluble in water. Further, the TiO outer layer 106a of the deposit 106 (see FIG. 4A) also reacts with fluorine to become $TiF_5$ or $TiF_6$.

After the plasma treatment, the semiconductor substrate 303 is rinsed. For example, the semiconductor substrate 303 is transferred to a rinsing apparatus (not shown) and rinsed with pure water for 10 minutes. Since the deposit 106 has been converted into a water-soluble component ($TiF_5$ or $TiF_6$), the deposit 106 is removed away from the substrate by the rinsing treatment.

In this manner, according to the method for manufacturing the electronic device of Embodiment 4, the plasma treatment and the following rinsing treatment achieve the removal of the deposit 106. Therefore, according to the method for manufacturing the electronic device of Embodiment 4, defects such as a short caused by the deposit are prevented from occurring, thereby reducing failure in the semiconductor elements.

In this embodiment, the plasma treatment is performed with the $NF_3$ gas. However, the gas is not limited thereto and any gas is available as long as it contains a fluorine element. For example, $CF_4$, $CHF_3$ and the like are applicable. The gas may also be a mixture of several kinds of gases.

The rinsing of the semiconductor substrate 303 after the plasma treatment is carried out with pure water, but the present invention is not limited thereto. In place of the pure water, any chemical solution may be used as long as it does not dissolve the TiN film 103. For example, an aqueous solution of HF, HCl or the like may be used.

Embodiment 5

Now, with reference to the drawings, an explanation is given of Embodiment 5 of the present invention.

FIGS. 1A to 1D and FIGS. 2A to 2D illustrate the steps of a method for manufacturing an electronic device according to Embodiment 5 of the present invention. Embodiment 5 is different from Embodiment 1 in the step of removing the deposit 106 corresponding to FIG. 2A. Therefore, in this embodiment, the removal step is described in detail and an explanation of the other steps same as those of Embodiment 1 is omitted.

In this embodiment, the deposit 106 is removed by treatment with gaseous HF and the following rinsing treatment. The gaseous HF mentioned herein is a gaseous mixture of $N_2$ used as inert gas and HF.

Figure 8A:
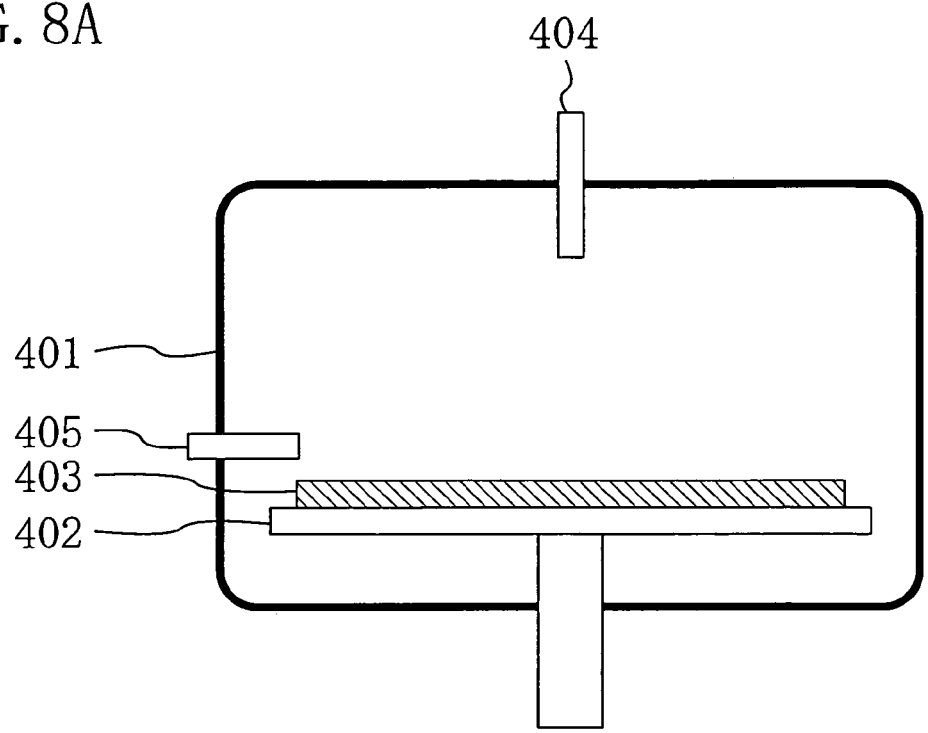
FIGS. 8A and 8B are schematic views illustrating treatment apparatuses used for removing the deposit according to the method for manufacturing the electronic device of Embodiment 5 of the present invention.
Figure 8B:
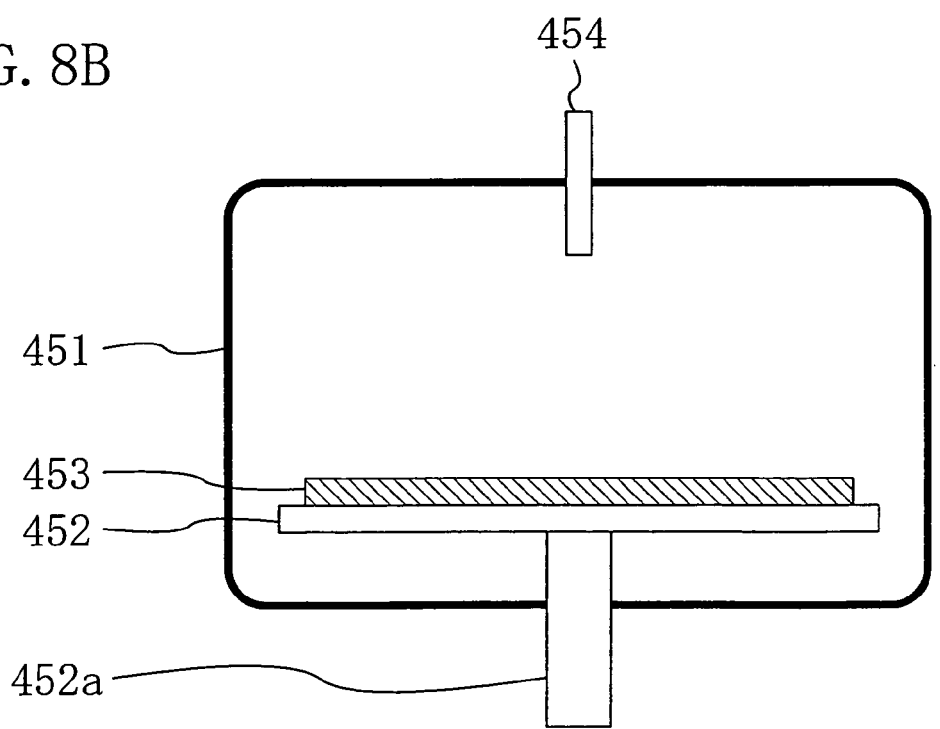

FIGS. 8A and 8B are schematic views illustrating treatment apparatuses used for the removal of the deposit 106 in this embodiment. FIG. 8A shows a treatment apparatus for the treatment with gaseous HF and FIG. 8B shows a rinsing apparatus for the rinsing treatment. Hereinafter, the structure of the apparatuses is described.

The treatment apparatus shown in FIG. 8A includes a first sample stage 402 which is provided in a first chamber 401 so that a semiconductor substrate 403 is placed thereon. The first chamber 401 is provided with a gas feed nozzle 404 for feeding gas into the first chamber 401 and an outlet 405 for discharging the gas out of the first chamber 401.

The rinsing apparatus shown in FIG. 8B includes a second sample stage 452 which is provided in a second chamber 451 so that a semiconductor substrate 453 is placed thereon.

The second sample stage 452 is connected to a drive (not shown) provided below the second chamber 451 via a shaft 452a such that the sample stage 452 rotates about the shaft 452a.

Further, a pure water feed nozzle 454 is provided at the top of the second chamber 451 so that pure water is fed onto the semiconductor substrate 453.

Now, an explanation is given of how to remove the deposit 106 using these apparatuses in this embodiment.

First, with the treatment apparatus shown in FIG. 8A, the semiconductor substrate 403 which has gone through the steps before the step shown in FIG. 1D and on which the deposit 106 has been generated is subjected to treatment with gaseous HF.

More specifically, first, the semiconductor substrate 403 is placed on the sample stage 402.

Then, gaseous HF, which is a gaseous mixture prepared by mixing anhydrous hydrogen fluoride with $N_2$ gas in a concentration of 0.5 mass %, is fed into the first chamber 401 through the gas feed nozzle 404. In this manner, the semiconductor substrate 403 is subjected to the gaseous HF treatment for 30 seconds.

By so doing, TiFx (x is 1 to 3) which is a component of the deposit 106 and fluorine contained in the gaseous HF produce $TiF_5$ or $TiF_6$ which is soluble in water. The TiO outer layer 106a of the deposit 106 (see FIG. 4A) is also converted into $TiF_5$ or $TiF_6$ through the reaction with fluorine.

Then, with the rinsing apparatus shown in FIG. 8B, the semiconductor substrate treated with the gaseous HF is rinsed.

Before rinsing, the semiconductor substrate 403 treated with the gaseous HF is taken out of the gaseous HF treatment apparatus and placed on the second sample stage 452 of the rinsing apparatus as the semiconductor substrate 453.

Then, while the second sample stage 452 is rotated, pure water is fed onto the semiconductor substrate 453 from the pure water feed nozzle 452. In this way, the semiconductor substrate 453 is rinsed with pure water for 10 minutes.

Since the deposit 106 has been converted into a water-soluble component through the gaseous HF treatment, the deposit 106 is removed away by the following rinsing with pure water. Thus, according to the method for manufacturing the electronic device of this embodiment, defects such as a short caused by the deposit is prevented from occurring, thereby reducing failure in the semiconductor elements.

In this embodiment, the gaseous HF used contains 0.5 mass % of anhydrous hydrogen fluoride, but the present invention is not limited thereto. For example, the effect of this embodiment is surely obtained by using gaseous HF containing 0.1 mass % or more and 4.0 mass % or less of anhydrous hydrogen fluoride. That is, as long as the concentration of anhydrous hydrogen fluoride is 0.1 mass % or more and 4.0 mass % or less, the deposit 106 is surely removed while damage to the TiN film 103 is controlled.

In this embodiment, the semiconductor substrate 453 is rinsed with pure water after the gaseous HF treatment. However, this is not limitative and any chemical solution may be used for the rinsing as long as it does not dissolve the TiN film 103. For example, an aqueous solution of HF or HCl may be used.

Embodiment 6

Now, with reference to the drawings, an explanation is given of Embodiment 6 of the present invention.

FIGS. 1A to 1D and FIGS. 2A to 2D illustrate the steps of a method for manufacturing an electronic device according to Embodiment 6 of the present invention. Embodiment 6 is different from Embodiment 1 in the step of removing the deposit 106 corresponding to FIG. 2A. Therefore, in this embodiment, the removal step is described in detail and an explanation of the other steps same as those of Embodiment 1 is omitted.

In this embodiment, the deposit 106 is removed by treatment with a chemical solution containing fluorine ions while a voltage is applied to the semiconductor substrate. More specifically, the semiconductor substrate is treated with a chemical solution containing 0.1 mass % or more of HF while a voltage of 0.1 V or higher is applied to the semiconductor substrate.

FIG. 9 is a schematic view illustrating an example of a treatment apparatus used in this embodiment.

The treatment apparatus includes a horizontally rotatable sample stage 502 provided in a chamber 501 such that a semiconductor substrate 503 is placed thereon. Further, a chemical solution feed nozzle 504 is provided at the top of the chamber 501 to feed a chemical solution onto the semiconductor substrate 503. A pure water feed nozzle 505 is provided at the side of the chamber 501 to feed pure water onto the semiconductor substrate 503. However, it should be understood that the apparatus is not limited to this structure.

The sample stage 502 is electrically connected to a direct current power supply 506 so that a voltage is applied to the semiconductor substrate 503 placed on the sample stage 502.

With the above-described apparatus, the semiconductor substrate 503 which has gone through the steps before the step shown in FIG. 1D and on which the deposit 106 has been generated is treated in the following manner.

First, the semiconductor substrate 503 is placed on the sample stage 502.

Then, a voltage of 0.1 V is applied to the semiconductor substrate 503 from the direct current power supply 506 and a chemical solution containing 0.1 mass % or more of HF is fed onto the semiconductor substrate 503 through the chemical solution feed nozzle 504. At this time, the sample stage 502 is rotated to rotate the semiconductor substrate 503. In this way, the semiconductor substrate 503 is treated for 30 seconds.

Then, pure water is fed onto the semiconductor substrate 503 from the pure water feed nozzle 505 to rinse the substrate for 10 minutes.

According to the above-described method, the voltage application to the semiconductor substrate 503 allows reducing electron density at the surface of the deposit 106 generated on the semiconductor substrate 503. Therefore, fluorine ions $F^-$ are easily adsorbed onto the surface of the deposit 106, thereby promoting the reaction of dissolving the deposit 106 away in the same manner as described in Embodiment 2.

As a result, time required for removing the deposit is reduced without increasing the HF concentration. Further, since the treatment time is reduced, the amount of the first interlayer insulating film 101 or the like etched during the treatment is reduced. This allows an improvement in precision in fine patterning.

In this embodiment, a voltage of 0.1 V is applied to the semiconductor substrate 503. However, the voltage is not limited to 0.1 V and the effect of this embodiment is surely obtained as long as the voltage is 0.1 V or higher.

In Embodiments 1 to 6, the substrates used are semiconductor substrates. However, the substrates may be other substrates such as insulating substrates.

In Embodiments 1 to 6, the method for manufacturing the electronic device is explained in connection to the manufacture of a semiconductor device. However, the electronic device mentioned in the present invention is not limited to the semiconductor device.

In Embodiments 1 to 6, the TiN film is taken as an example of the Ti-containing metal film, but the metal film containing Ti is not limited to the TiN film only. For example, a film made of TiAlN or TiSiN (used as a barrier metal) may also be applicable. In addition, a BST film ($Ba_{0.5}Sr_{0.5}TiO_3$ film used as a dielectric film) or a Ti film may also be used.

The deposit containing titanium fluoride is removed by the method of the present invention regardless of the cause of the generation thereof. That is, the deposit mentioned herein is not limited to the one generated through etching of a Ti-containing film using fluorine-containing gas. For example, the method of the present invention is also applicable to the removal of a compound containing titanium fluoride produced through ashing using a fluorine-containing gas.

What is claimed is:

1. A method for manufacturing an electronic device comprising the steps of:
    dry-etching a Ti-containing metal film formed on a substrate with a gas containing fluorine;
    treating the substrate with a chemical solution containing fluorine ions, and
    removing a deposit containing TiFx generated on the substrate after the dry etching step.

2. A method according to claim 1, wherein
    the chemical solution is an aqueous solution containing 0.1% by weight or more of hydrofluoric acid.

3. A method according to claim 1, wherein
    the step of treating the substrate with the chemical solution includes the step of reducing electron density at the surface of the deposit by adsorbing $H^+$ on the surface of the deposit.

4. A method according to claim 3, wherein
    the chemical solution used to treat the substrate to reduce the electron density at the surface of the deposit has a pH of 1 or less.

5. A method according to claim 3, wherein
    the chemical solution used to treat the substrate to reduce the electron density at the surface of the deposit contains hydrochloric acid.

6. A method according to claim 3, wherein
    a voltage is applied to the substrate to reduce the electron density at the surface of the deposit.

7. A method for manufacturing an electronic device comprising the steps of:
    dry-etching a Ti-containing metal film formed on a substrate with a gas containing fluorine;
    reducing the electron density at the surface of the substrate by adsorbing $H^+$ on the surface of the substrate after the dry etching step; and
    treating the substrate with a chemical solution containing fluorine ions after the step of reducing the electron density.

8. A method according to claim 7, wherein
    the electron density at the surface of the substrate is reduced by treating the surface of the substrate with hydrochloric acid.

9. A method according to claim 7, wherein
    a voltage is applied to the substrate to reduce the electron density at the surface of the substrate.

10. A method according to claim 1, further comprising the step of reducing the electron density at the surface of the deposit by adsorbing $H^+$ on the surface of the deposit after the dry etching step and before the step of treating the substrate with the chemical solution.

11. A method according to claim 10, wherein
    the electron density at the surface of the deposit is reduced by treating the surface of the deposit with hydrochloric acid.

12. A method according to claim 11, wherein
    a voltage is applied to the substrate to reduce the electron density at the surface of the deposit.

* * * * *